US011877470B2

(12) United States Patent
Wang

(10) Patent No.: US 11,877,470 B2
(45) Date of Patent: Jan. 16, 2024

(54) DISPLAY MODULE INCLUDING FLUID MATERIAL FILLED ACCAMODATION SPACE

(71) Applicant: WUHAN CHINA STAR OPTOELECTRONICS SEMICONDUCTOR DISPLAY TECHNOLOGY CO., LTD., Wuhan (CN)

(72) Inventor: Wenqiang Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 428 days.

(21) Appl. No.: 17/254,239

(22) PCT Filed: Sep. 14, 2020

(86) PCT No.: PCT/CN2020/114988
§ 371 (c)(1),
(2) Date: Dec. 18, 2020

(87) PCT Pub. No.: WO2022/041332
PCT Pub. Date: Mar. 3, 2022

(65) Prior Publication Data
US 2022/0320464 A1    Oct. 6, 2022

(30) Foreign Application Priority Data
Aug. 27, 2020   (CN) .......................... 202010878380.4

(51) Int. Cl.
*H10K 50/84*     (2023.01)
*H10K 50/844*    (2023.01)
(Continued)

(52) U.S. Cl.
CPC ........... *H10K 50/844* (2023.02); *G09F 9/301* (2013.01); *G09F 9/33* (2013.01); *G09G 2380/02* (2013.01);
(Continued)

(58) Field of Classification Search
CPC .... H10K 50/844; H10K 50/841; H10K 50/84; H10K 50/868; H10K 50/8428;
(Continued)

(56) References Cited

U.S. PATENT DOCUMENTS 9,569,018 B2 *   2/2017  Kang ...................... G06F 3/03
2008/0018631 A1 * 1/2008  Hioki ............... G02F 1/133526
                                                       345/206
(Continued)

FOREIGN PATENT DOCUMENTS

CN        102522420 A      6/2012
CN        107564415 A  *  1/2018
(Continued)

OTHER PUBLICATIONS

International Search Report in International application No. PCT/CN2020/114988,dated Apr. 20, 2021.
(Continued)

*Primary Examiner* — Ida M Soward
(74) *Attorney, Agent, or Firm* — PV IP PC; Wei Te Chung; Zhigang Ma

(57) ABSTRACT

A display module is provided, which includes a display panel and a support structure. The display panel includes a bending region, and the support structure includes a first encapsulation layer, support plates, and a second encapsulation layer sequentially disposed on the display panel. An accommodation space is defined among the first encapsulation layer, the support plates, and the second encapsulation layer, the accommodation space is positioned corresponding
(Continued)

to the bending region, and a fluid material is arranged in the accommodation space.

20 Claims, 3 Drawing Sheets

(51) Int. Cl.
*H10K 50/80* (2023.01)
*H10K 50/842* (2023.01)
*G09F 9/33* (2006.01)
*H01L 27/146* (2006.01)
*H10K 102/00* (2023.01)
*G09F 9/30* (2006.01)
*H10K 77/10* (2023.01)

(52) U.S. Cl.
CPC ........ *H01L 27/14678* (2013.01); *H10K 50/84* (2023.02); *H10K 50/841* (2023.02); *H10K 50/8428* (2023.02); *H10K 50/868* (2023.02); *H10K 77/111* (2023.02); *H10K 2102/311* (2023.02)

(58) Field of Classification Search
CPC ............ H10K 77/111; H10K 2102/311; H01L 27/14678; G09F 9/301; G09F 9/33; G09G 2380/02
See application file for complete search history.

(56) References Cited

U.S. PATENT DOCUMENTS

| | | | | |
|---|---|---|---|---|
| 2014/0268780 | A1* | 9/2014 | Wang | ................. H05K 1/028 |
| | | | | 362/249.06 |
| 2018/0166652 | A1 | 6/2018 | Kim | |
| 2019/0146261 | A1* | 5/2019 | Im | ................. G02F 1/133305 |
| | | | | 349/106 |

FOREIGN PATENT DOCUMENTS

| | | | | |
|---|---|---|---|---|
| CN | 107564415 | A | | 1/2018 |
| CN | 108470523 | A | | 8/2018 |
| CN | 108470523 | A | * | 8/2018 |
| CN | 207818084 | U | | 9/2018 |
| CN | 208141720 | U | | 11/2018 |
| CN | 208141720 | U | * | 11/2018 |
| CN | 109523915 | A | | 3/2019 |
| CN | 109630842 | A | | 4/2019 |
| CN | 109630842 | A | * | 4/2019 |
| CN | 209312360 | U | * | 8/2019 |
| CN | 209312360 | U | | 8/2019 |
| CN | 209447443 | U | * | 9/2019 |
| CN | 210627729 | U | * | 5/2020 |
| CN | 210722214 | U | | 6/2020 |
| CN | 111524934 | A | | 8/2020 |
| CN | 111540838 | A | | 8/2020 |
| WO | WO-2019218710 | A1 | * | 11/2019 ........... B32B 15/043 |

OTHER PUBLICATIONS

Written Opinion of the International Search Authority in International application No. PCT/CN2020/114988, dated Apr. 20, 2021.
Chinese Office Action issued in corresponding Chinese Patent Application No. 202010878380.4 dated Mar. 23, 2021, pp. 1-6.

* cited by examiner

DISPLAY MODULE INCLUDING FLUID MATERIAL FILLED ACCAMODATION SPACE

RELATED APPLICATIONS

This application is a Notional Phase of PCT Patent Application No. PCT/CN2020/114988 having international filing date of Sep. 14, 2020, which claims the benefit of priority of Chinese Patent Application No. 202010878380.4 filed on Aug. 27, 2020. The contents of the above applications are all incorporated by reference as if fully set forth herein in their entirety.

FIELD OF INVENTION

The present application relates to the field of display technologies, and in particular to a display module.

BACKGROUND OF INVENTION

With increasing innovation and progress of electronic display technologies, consumers have higher demands for display modes and display effects of new electronic products. Foldable, curved, curled, and transparent display modes are currently research hotspots in the field of electronic display. In recent years, the above concepts have become a reality due to increasing maturity of organic light emitting diode (OLED) display technology and active matrix light emitting diode (AMOLED) technology.

A core of OLED display technology is that pixels of a display layer can realize self-luminescence without backlight, have advantages of wide viewing angles, high contrast ratio, low power consumption, and fast response times, etc., and mainly use very thin organic material coating and glass substrate. Compared with a liquid crystal display module, an OLED display module has a greater reduction in thickness. Therefore, the OLED display module can still maintain good display performance in a bent and folded state, which makes flexible display possible.

Technical Problem

At present, an overall stacked thickness of a typical flexible display module is relatively thick, so a greater rigidity exists in a thickness direction and it is not easy to bend, wherein its structure specifically consists of a protective layer, a touch layer, a polarizer layer, a display function layer, and a support layer. Among them, the support layer is a steel plate of a bottom layer of the module, which plays a role of supporting and restoring flattening. However, since an elastic modulus of the steel plate is much greater than that of an adjacent adhesive layer, it hardly undergoes expansion and contraction along a curved surface during bending, and has poor coordination with a deformation of the adhesive layer. After many times of bending and flattening, a screen cannot be restored to an original flat state, unrecoverable wave-shaped wrinkles or even debonding and failure occurs, which directly affects usage effect and service life of a product.

SUMMARY OF INVENTION

Technical Solutions

The present application provides a display module to solve a problem of unrecoverable wrinkles and film debonding that occur during a bending process of a display module.

The present application provides a display module, which includes:
- a display panel including a bending region and a non-bending region defined on both sides of the bending region;
- a support structure including a first encapsulation layer, a second encapsulation layer, and a plurality of support plates sandwiched between the first encapsulation layer and the second encapsulation layer, wherein the support plates are arranged at intervals and correspondingly disposed in the non-bending region; and
- an accommodation space defined among the first encapsulation layer, the support plates, and the second encapsulation layer, and correspondingly arranged in the bending region, wherein a fluid material is arranged in the accommodation space, and the fluid material is a lubricating material.

In the display module according to the present application, the support structure further includes an elastic sheet disposed between adjacent two of the support plates, and the elastic sheet is disposed in the accommodation space corresponding to the bending region.

In the display module according to the present application, the elastic sheet includes an elastic body and sliding parts connected to two ends of the elastic body, and the sliding parts are slidingly connected to the adjacent ones of the support plates.

In the display module according to the present application, a sliding slot is defined on a side of each of the support plates close to the elastic sheet, and each of the sliding parts is disposed in the sliding slot.

In the display module according to the present application, the elastic sheet is defined with at least one through hole.

In the display module according to the present application, the elastic body is in an undulating configuration.

In the display module according to the present application, the elastic body includes a plurality of convex sheets arranged side by side at intervals and a connection section connected between adjacent two of the convex sheets, and a groove is formed between adjacent two of the convex sheets and the connection section.

In the display module according to the present application, each of the convex sheets includes a horizontal part and an inclined part connected to both sides of the horizontal part, and the inclined part is defined with at least one through hole.

In the display module according to the present application, a number of the at least one through hole is multiple, and the multiple through holes are uniformly spaced apart from each other along an extending direction of the inclined part.

The present application further provides a display module, including:
- a display panel including a bending region;
- a support structure including a first encapsulation layer, a second encapsulation layer, and a plurality of support plates sandwiched between the first encapsulation layer and the second encapsulation layer, wherein the support plates are arranged at intervals; and
- an accommodation space defined among the first encapsulation layer, the support plates, and the second encapsulation layer, and correspondingly arranged in the bending region, wherein a fluid material is arranged in the accommodation space.

In the display module according to the present application, the fluid material is a lubricating material.

In the display module according to the present application, the display panel further includes a non-bending region defined on both sides of the bending region, the support structure further includes an elastic sheet disposed between adjacent two of the support plates, the elastic sheet is disposed in the accommodation space and corresponding to the bending region, and the support plates are correspondingly disposed in the non-bending region.

In the display module according to the present application, the elastic sheet includes an elastic body and sliding parts connected to two ends of the elastic body, and the sliding parts are slidingly connected to the adjacent ones of the support plates.

In the display module according to the present application, a sliding slot is defined on a side of each of the support plates close to the elastic sheet, and each of the sliding parts is disposed in the sliding slot.

In the display module according to the present application, the elastic sheet is defined with at least one through hole.

In the display module according to the present application, the elastic body is in an undulating configuration.

In the display module according to the present application, the elastic body includes a plurality of convex sheets arranged side by side at intervals and a connection section connected between adjacent two of the convex sheets, and a groove is formed between adjacent two of the convex sheets and the connection section.

In the display module according to the present application, each of the convex sheets includes a horizontal part and an inclined part connected to both sides of the horizontal part, and the inclined part is defined with the at least one through hole.

In the display module according to the present application, a number of the at least one through hole is multiple, and the multiple through holes are uniformly spaced apart from each other along an extending direction of the inclined part.

In the display module according to the present application, an encapsulation region and an adhesive region are defined on each of the support plates, the adhesive region is positioned on a side of the encapsulation region away from the bending region, a part of the first encapsulation layer is disposed in the encapsulation region, and the display module further includes an adhesive layer disposed between the display panel and each of the support plates and positioned in the adhesive region.

Beneficial Effect

Compared with a display module in a conventional art, a support structure in the display module provided by the present application includes a first encapsulation layer, support plates, and a second encapsulation layer sequentially disposed on a display panel, wherein the support plates are arranged at intervals. An accommodation space is defined among the first encapsulation layer, the support plates, and the second encapsulation layer, and is correspondingly arranged in a bending region, wherein a fluid material is arranged in the accommodation space. The present application reduces a friction between the support structure and the display panel by arranging the fluid material in the accommodation space inside the support structure, so that a shear stress generated between the support structure and the display panel caused by bending is reduced. Therefore, the problem of unrecoverable wrinkles and film debonding during the bending process of the display module is solved.

BRIEF DESCRIPTION OF FIGURES

In order to illustrate the technical solutions of the present application or the related art in a clearer manner, the drawings desired for the present application or the related art will be described hereinafter briefly. Obviously, the following drawings merely relate to some embodiments of the present application, and based on these drawings, a person skilled in the art may obtain the other drawings without any creative effort.

DETAILED DESCRIPTION OF EMBODIMENTS

Figure 1:
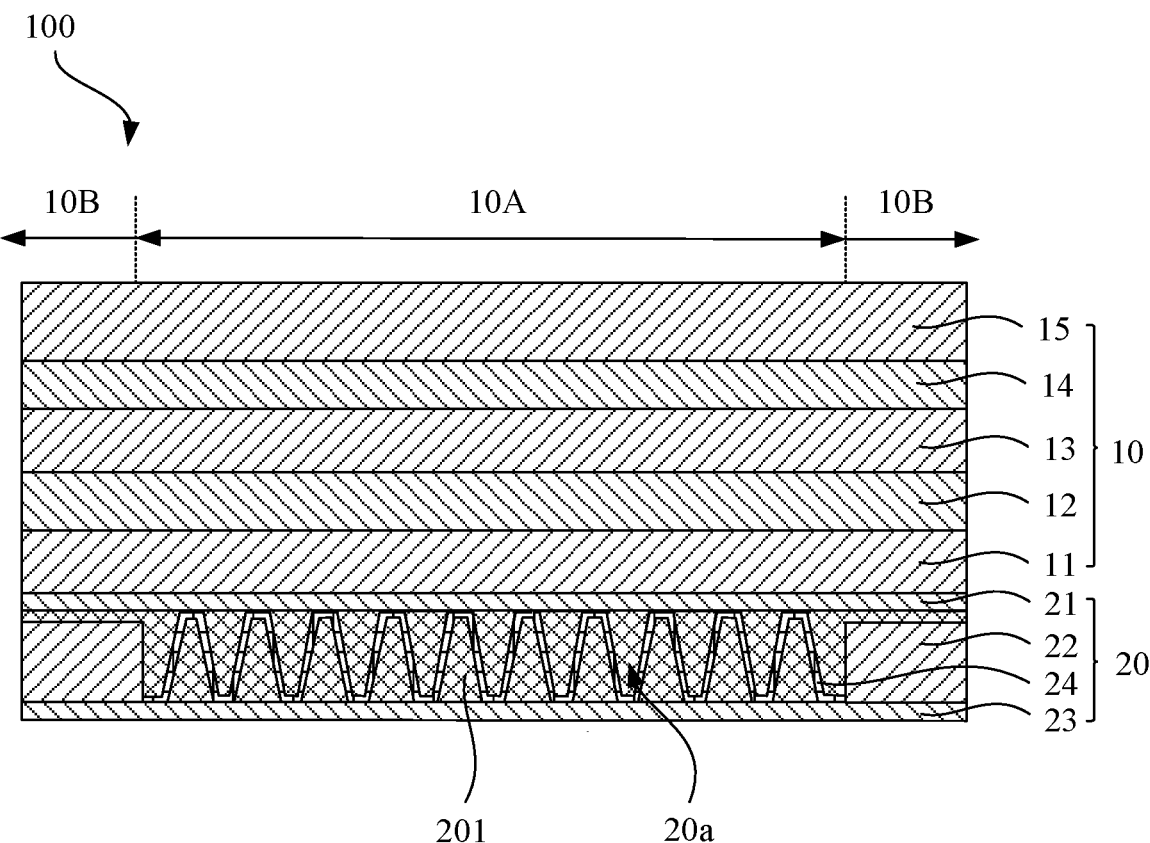
FIG. 1 is a schematic structural diagram of a display module according to an embodiment of the present application.

The following content combines with the drawings and the embodiment for describing the present application in detail. It is obvious that the following embodiments are merely some embodiments of the present application, but not all the embodiments. Based on the embodiments in the present application, for the skilled persons of ordinary skill in the art without creative effort, the other embodiments obtained thereby are still covered by the present application.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the description of the present application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in the present application can be understood according to specific situations.

In the present invention, the first feature "on" or "under" the second feature can include direct contact of the first and second features, and can also be included that the first and second features are not in direct contact but are contacted by additional features between them, unless otherwise specifically defined and defined. Moreover, the first feature is "above", "on", and "on the top of" of the second feature, including the first feature directly above and diagonally above the second feature, or simply means that the first feature is horizontally higher than the second feature. The first feature is "under", "below", and "beneath" the second feature, including the first feature directly below and diagonally below the second feature, or merely the first feature is horizontally less than the second feature.

The following disclosure provides many different implementations or examples for implementing different structures of the present application. To simplify the disclosure of the present application, the components and settings of specific examples are described below. Of course, they are merely examples and are not intended to limit the application. Furthermore, the present application may repeat reference numbers and/or reference letters in different examples, and such repetition is for the sake of simplicity and clarity, and does not by itself indicate a relationship between the various embodiments and/or settings discussed. In addition, examples of various specific processes and materials are provided in the present application, but those of ordinary skill in the art can be aware of the application of other processes and/or the use of other materials.

Please refer to FIG. 1, where FIG. 1 is a schematic structural diagram of a display module according to an embodiment of the present application.

An embodiment of the present application provides a display module 100, which includes a display panel 10 and a support structure 20. The display panel 10 includes a bending region 10A and a non-bending region 10B disposed on both sides of the bending region 10A. The support structure 20 includes a first encapsulation layer 21, a second encapsulation layer 23, and a plurality of support plates 22 sandwiched between the first encapsulation layer 21 and the second encapsulation layer 23. The support plates 22 are arranged at intervals. Wherein, an accommodation space 20a is defined among the first encapsulation layer 21, the support plates 22, and the second encapsulation layer 23. The accommodation space 20a is positioned corresponding to the bending region 10A. A fluid material 201 is arranged in the accommodation space 20a.

Therefore, the embodiment of the present application reduces a friction between the support structure 20 and the display panel 10 by arranging the fluid material 201 in the accommodation space 20a inside the support structure 20, so that a shear stress generated between the support structure 20 and the display panel 10 caused by bending is reduced, thereby improving a coordination of deformation between the support structure 20 and the display panel 10, and a problem of unrecoverable wrinkles and film debonding that occur during a bending process of the display module is relieved.

In the present embodiment, the display panel 10 includes a display function layer 11, a touch function layer 12, a polarizer 13, an optical adhesive layer 14, and a protective layer 15 disposed in sequence. The display function layer 11 is disposed on the first encapsulation layer 21. The display function layer 11 can be an organic light emitting diode display layer or a liquid crystal display layer. The present embodiment only takes the display function layer 11 as the organic light emitting diode display layer for description, but is not limited to this.

It is understandable that, in the conventional art, an optical adhesive layer or a pressure-sensitive adhesive layer is usually adopted between the support structure and the display panel for full bonding. When the display module is repeatedly bent and flattened, accumulated microscopic damage will gradually form inside the optical adhesive layer or pressure-sensitive adhesive layer and between a contact interface with the display panel. And when a bending and flattening process is performed continuously for a certain number of times, the microscopic damage will evolve into a visible debonding phenomenon of films. For example, the optical adhesive layer or the pressure-sensitive adhesive layer will lose its adhesion and fail, thereby greatly reducing a performance of a display product.

In view of the problems in the conventional art, the present embodiment redesigns the support structure, by arranging the fluid material 201 in the accommodation space 20a in the support structure 20, and using the first encapsulation layer 21 and the second encapsulation layer 23 to encapsulate the fluid material 201 to prevent it from overflowing, which greatly reduces the friction between the support structure 20 and the display panel 10, and improves a deformation coordination between the two. In addition, since the support structure 20 of the present embodiment does not use the optical adhesive layer or the pressure-sensitive adhesive layer in the bending region 10A, an occurrence of failure of the optical adhesive layer or the pressure-sensitive adhesive layer is effectively prevented, and a bending performance of the display module is greatly improved.

In the present embodiment, the accommodation space 20a further includes a corresponding portion of the non-bending region 10B. Specifically, the support plates 22 are disposed in the non-bending region 10B, and the accommodation space 20a includes a portion defined between the support plates 22 and the first encapsulation layer 21.

It can be understood that during the bending and flattening process of the display module, a stress on a portion of the display module positioned in the non-bending region 10B gradually increases along a direction close to the bending region 10A. Therefore, by an arrangement of the fluid material 201 in the non-bending region 10B as described above, the friction between an entire support structure 20 and the display panel 10 is reduced, and problems of wrinkling and even debonding caused by poor deformation coordination between the film layers during the bending or flattening process at a partial position of the display module are prevented.

In the present embodiment, the fluid material 201 can be a lubricating material. Wherein, the lubricating material is a polymer lubricating material with high optical permeability. The use of the lubricating material reduces the friction between the display module 100 at a position corresponding to the bending region 10A and the support structure 20 during the bending process, and the shear stress at a contact interface between the two is significantly reduced, thereby a deformation coordination capability between the display panel 10 and the support structure 20 is improved.

Specifically, the lubricating material can be a single high molecular polymer, such as polyether synthetic oil, alkylbenzene oil, or other high molecular polymers, or a mixture of different high molecular polymers. For example, under the premise of not affecting an overall display quality of the module, through a blending of different high molecular polymer components, a mixture can have good lubrication and adhesion effects, and have more reliable optical characteristics and greater specific heat capacity, thereby significantly reducing the friction between the display panel 10 and the support structure 20 to a certain extent.

In some embodiments, the fluid material 201 can also be a non-oily liquid, such as water and other materials with lubricating effect, which will not be repeated here.

In the present embodiment, a material of the first encapsulation layer 21 is composite resin. The composite resin can be a composite material of an inorganic material and an organic material, which has both water and oxygen barrier properties of inorganic materials and good film-forming properties of organic materials. In addition, while the composite resin has a good encapsulation effect, it also has a higher bonding effect, so as to better bond the display panel 10 and the support structure 20. Furthermore, since resin material has a certain lubricating effect, compared with the optical adhesive layer or pressure-sensitive adhesive layer in the conventional art, the resin material has a certain lubricating effect, which can improve the deformation coordination capability between the display panel 10 and the support structure 20.

It should be noted that the first encapsulation layer 21 can be a single-layer structure or a multi-layer structure, which is not limited in the present application.

In addition, in the present embodiment, a material of the second encapsulation layer 23 is same as the material of the first encapsulation layer 21. In some embodiments, the material of the second encapsulation layer 23 and the material of the first encapsulation layer 21 may also be different, which is not limited in the present application.

Refer to FIG. 1 to FIG. 4. In the present embodiment, the support structure 20 further includes an elastic sheet 24 disposed between adjacent two of the support plates 22. The elastic sheet 24 is disposed in the accommodation space 20a and positioned corresponding to the bending region 10A. The support plates 22 are correspondingly disposed in the non-bending region 10B.

In the present embodiment, the elastic sheet 24 is configured as a supporter of the display panel 10 at the position of the display module 100 corresponding to the bending region 10A. Since the elastic sheet 24 has better deformability, the bending performance of the display module can be further improved. In addition, since the elastic sheet 24 has a deformation space during the bending and flattening process, a storage space of the fluid material 201 can be increased, and the friction between the display panel 10 and the support structure 20 can be further reduced. Furthermore, compared with a monolithic support, an arrangement of the elastic sheet 24 increases a heat dissipation region in the support structure 20 per unit space, thereby improving an overall heat dissipation effect of the display module, which is beneficial to increase the service life of the display module.

The elastic sheet 24 is a special steel plate. Specifically, the special steel plate is an alloy steel, such as an alloy steel containing metallic manganese, which has higher strength and toughness. Therefore, compared with an ordinary steel plate in the conventional art, under the premise of not affecting a supporting effect of the support structure 20, a thickness of the entire support structure 20 can be reduced by reducing a thickness of the elastic sheet 24 in the present embodiment, thereby helping to reduce an overall thickness of the display module.

The support plates 22 are rigid plastic plates. The use of the rigid plastic plates can reduce a weight of the support structure 20, which is beneficial to realize light weight and thinness of the display module.

Figure 2:
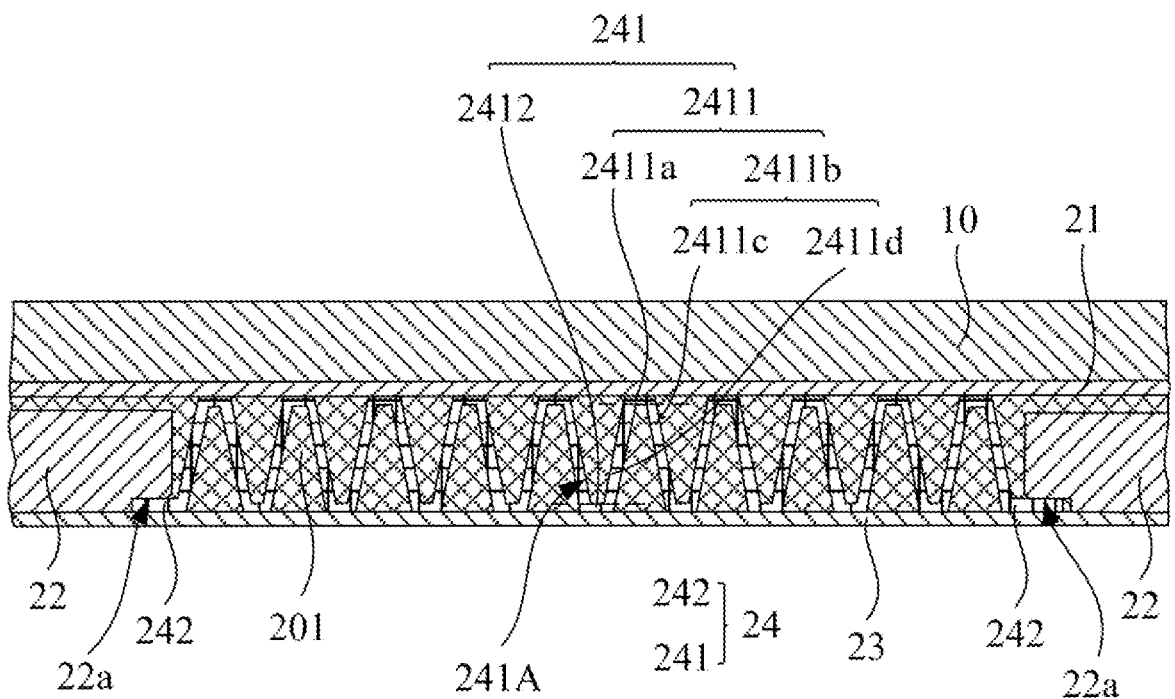
FIG. 2 is a schematic diagram of a partial enlarged structure of the display module according to the embodiment of the present application.

In the present embodiment, the elastic sheet 24 includes an elastic body 241 and sliding parts 242 connected to both ends of the elastic body 241, as shown in FIG. 2. The sliding parts 242 are slidably connected to the adjacent support plates 22. This arrangement can provide a certain sliding space for bending of the elastic sheet 24, which is convenient for the elastic sheet 24 to release stress during a sliding process. In addition, by means of sliding connection between the elastic sheet 24 and the support plates 22, disassembly and maintenance of the support structure 20 can be facilitated, thereby providing convenience for a manufacturing process.

In some embodiments, the elastic sheet 24 can also be fixedly connected to the support plates 22, and the present embodiment cannot be understood as a limitation of the present application.

Figure 3:
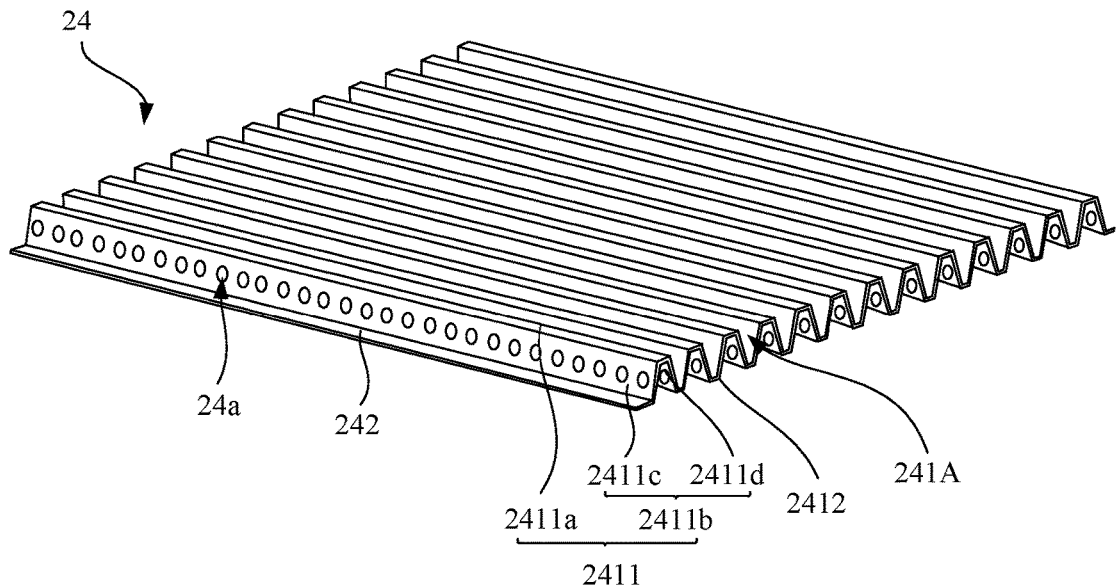
FIG. 3 is a schematic structural diagram of an elastic sheet in the display module according to the embodiment of the present application.

Refer to FIG. 2 and FIG. 3. A sliding slot 22a is defined on a side of each of the support plates 22 close to the elastic sheet 24. Each of the sliding parts 242 is disposed in the sliding slot 22a.

In the present embodiment, a number of the sliding slot 22a is one. Each of the sliding parts 242 is disposed in the sliding slot 22a and is slidably connected to one of the support plates 22.

In some embodiments, the number of the sliding slot 22a is multiple. The multiple sliding slots 22a are defined at intervals. Each of the sliding parts 242 includes a plurality of sub-sliding parts. Each of the sub-sliding parts is correspondingly disposed in a sliding slot 22a. Specifically, the sub-sliding parts are sliding sheets connected to the elastic body 241, and a number of the sliding sheets and a distance defined between the sliding sheets can be set according to actual conditions, which is not limited in the present application.

It is understandable that since the support structure 20 is provided with the fluid material 201, the elastic sheet 24 will be offset in an extending direction of the sliding parts 242 during repeated bending and flattening process. The above arrangement is through an arrangement of the multiple sliding slots 22a, so that each of the sub-sliding parts is confined in a corresponding sliding slot 22a, and is oriented to slide along with the bending or flattening of the display module, so that the elastic sheet 24 is limited, and an offset risk of the elastic sheet 24 is effectively reduced.

In the present embodiment, the elastic body 241 is in an undulating configuration. Optionally, a shape of the elastic body 241 can be a trapezoidal wave, a wave shape, a sawtooth shape, or a square wave, etc. The present application does not specifically limit the shape of the elastic body 241. This structure is beneficial for absorbing an impact energy caused by impact or extrusion of the display module, thereby effectively reducing a failure risk of an optical device layer and a metal wiring layer inside the display module. It should be noted that the present embodiment only takes the shape of the elastic body 241 as a trapezoidal wave as an example for description, but it is not limited to this.

Furthermore, the elastic body 241 includes a plurality of convex sheets 2411 arranged side by side at intervals and a connection section 2412 connected between adjacent two of the convex sheets 2411. A groove 241A is formed between adjacent two of the convex sheets 2411 and the connection section 2412. The fluid material 201 is placed in the groove 241A.

In the present embodiment, the elastic sheet 24 is defined with a through hole 24*a*. An arrangement of the through hole 24*a* reduces a flow resistance of the fluid material 201, so that the fluid material 201 can flow freely in the accommodation space 20*a*, and is distributed on a peripheral side of the elastic sheet 24. Thus, the elastic sheet 24 can realize free sliding during the bending and flattening process of the display module, which is beneficial to improve the deformation coordination between the display panel 10 and the support structure 20.

In addition, in the present embodiment, by providing the through hole 24*a* on the elastic sheet 24, a weight of the elastic sheet 24 can also be reduced, thereby reducing the weight of the support structure 20, which can not only reduce a weight of an entire display module, but also the through hole 24*a* plays a role of releasing a bending stress, so as to improve a deformability of the support structure 20, thereby improving the bending performance of the entire display module.

Furthermore, each of the convex sheets 2411 includes a horizontal part 2411*a* and an inclined part 2411*b* connected to both sides of the horizontal part 2411*a*. When the display module 100 is in a flat state, the horizontal part 2411*a* is attached to the first encapsulation layer 21. The inclined part 2411*b* is defined with the through hole 24*a*.

Specifically, the inclined part 2411*b* includes a first inclined part 2411*c* and a second inclined part 2411*d*. Extension tracks of the first inclined part 2411*c* and the second inclined part 2411*d* are symmetrically arranged with respect to a center line of the horizontal part 2411*a*. The through holes 24*a* are respectively defined on the first inclined part 2411*c* and the second inclined part 2411*d*.

Since the elastic sheet 24 is also wrapped in the fluid material 201, when the display module of the present embodiment is in a bent state, the elastic sheet 24 is stretched and deformed due to the bending stress, and then moves in a direction of the support plates 22. Moreover, in a process of stretching and deforming, the elastic sheet 24 will squeeze the fluid material 201, causing the fluid material 201 to flow. If the fluid material 201 does not have enough space to flow, it will react on the elastic sheet 24, causing a deformation of the elastic sheet 24 to be blocked. Therefore, through the inclined part 2411*b* of the convex sheets 2411 defined with the through holes 24*a*, a flow of the fluid material 201 when bending and restoring to the flat state is facilitated, so as to improve a deformation efficiency of the elastic sheet 24.

In some embodiments, the through holes 24*a* can also be defined on the horizontal part 2411*a*, which will not be repeated here.

In the present embodiment, a number of through holes 24*a* is multiple. The multiple through holes 24*a* are uniformly and spaced apart from each other along an extending direction of the inclined part 2411*b*. Specifically, both the first inclined part 2411*c* and the second inclined part 2411*d* are defined with through holes 24*a* uniformly spaced apart from each other. This arrangement can further reduce the flow resistance of the fluid material 201, thereby further improving free sliding ability of the elastic sheet 24 during the bending and flattening process.

Optionally, a shape of the through hole 24*a* can be circular, square, rectangular, or elliptical, etc. The present embodiment only takes the shape of the through hole 24*a* as circular as an example for description, but it should not be understood as a limitation of the application.

Figure 4:
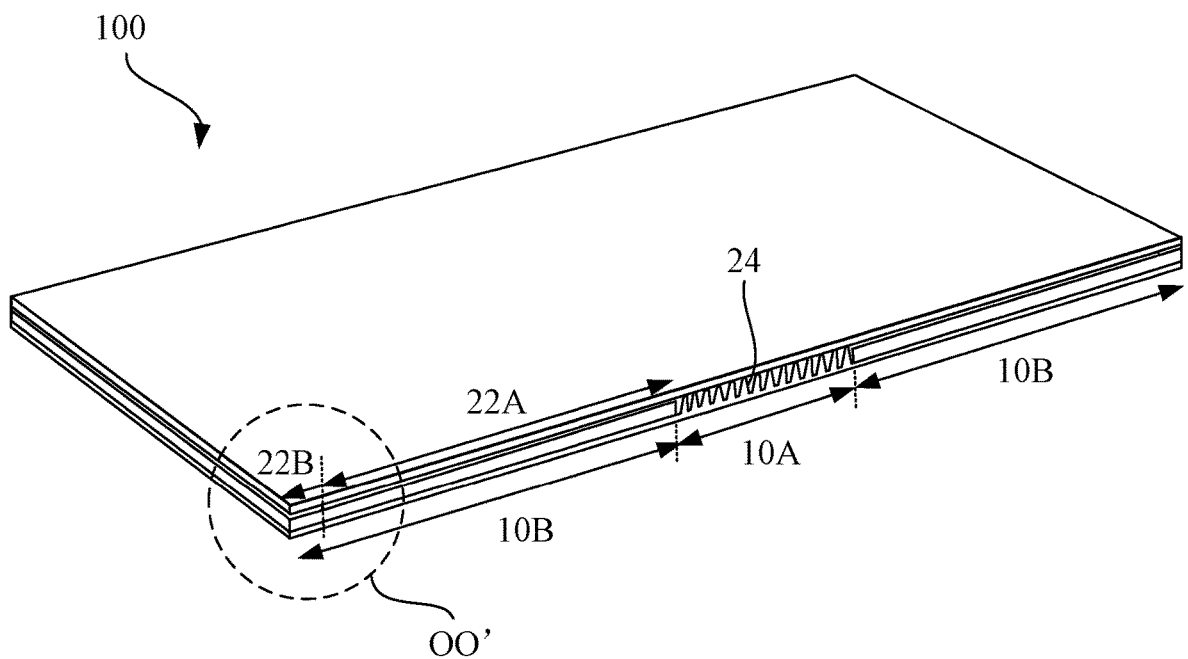
FIG. 4 is a schematic structural diagram of the display module in a flat state according to the embodiment of the present application.
Figure 5:
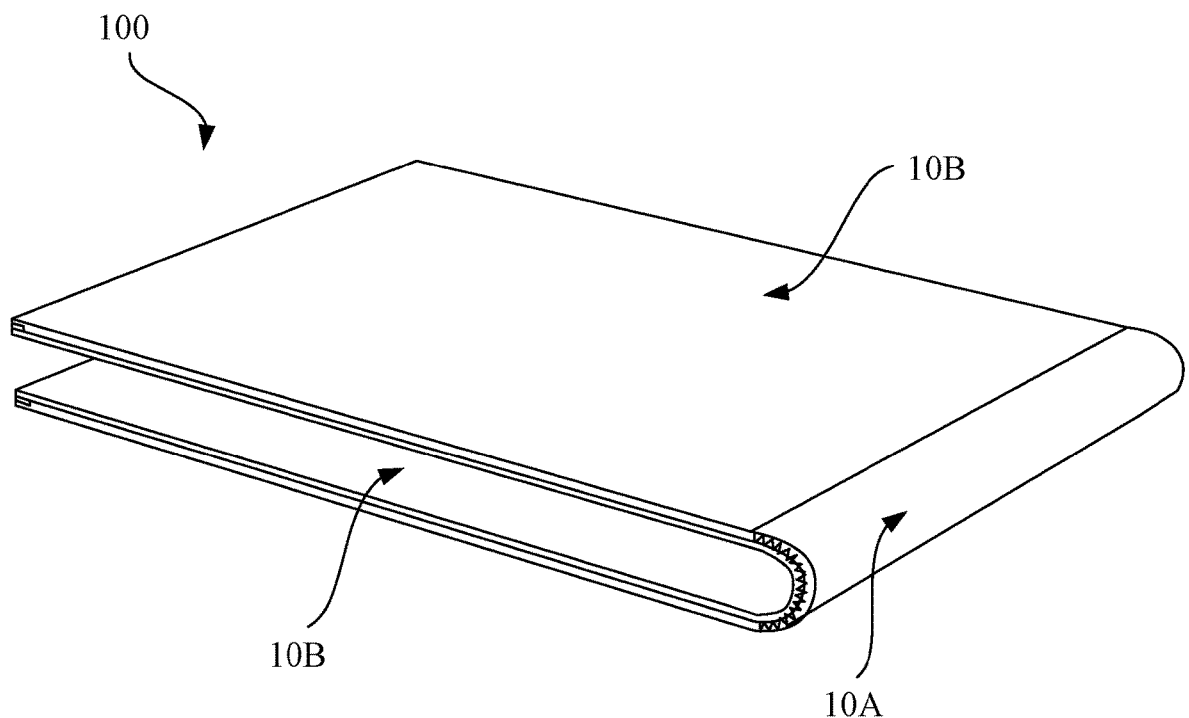
FIG. 5 is a schematic structural diagram of the display module in a bent state according to the embodiment of the present application.

Refer to FIG. 1 to FIG. 5, where FIG. 4 is a schematic structural diagram of the display module 100 according to the embodiment of the present application in the flat state, and FIG. 5 is a schematic structural diagram of the display module 100 according to the embodiment of the present application in the bent state.

In the present embodiment, by arranging lubricating material and elastic sheet 24 in the accommodation space 20*a* of the support structure 20, in one aspect, the arrangement of the lubricating material reduces the friction stress between the display panel 10 and the support structure 20, which improves the deformation coordination of the two, and further improves an overall bending performance of the display module; in another aspect, the arrangement of the elastic sheet 24 further improves the bending performance of the display module, and is favorable for realizing lightweight and thin design of the display module.

With reference to FIG. 4 and FIG. 5, the inventor of the present application has found in many experiments and investigations that the display module in the present embodiment does not have wrinkles or even debonding during multiple bending and flattening processes. The present application greatly improves the performance of the display product and the service life of the display product, thereby enhancing market competitiveness of the display product.

Figure 6:
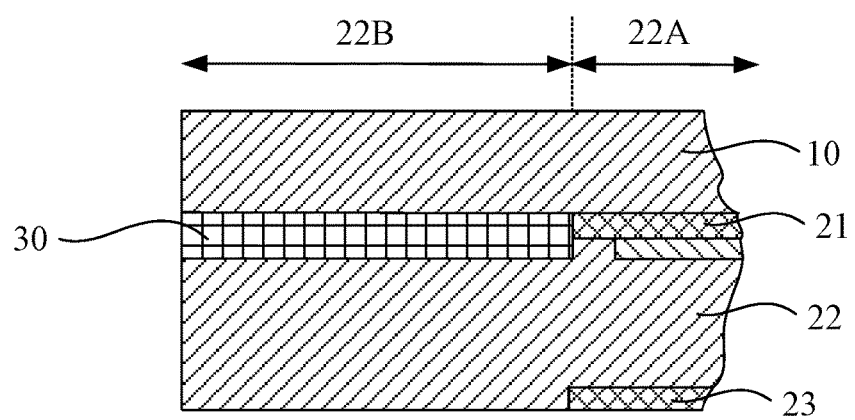
FIG. 6 is a schematic diagram of an enlarged structure taken along line O-O' in FIG. 4.

Refer to FIG. 4 and FIG. 6, where FIG. 6 is a schematic diagram of an enlarged structure taken along line O-O' in FIG. 4.

In the present embodiment, an encapsulation region 22A and an adhesive region 22B are defined on the support plate 22, the adhesive region 22B is positioned on a side of the encapsulation region 22A away from the bending region 10A, a part of the first encapsulation layer 21 is disposed in the encapsulation region 22A. The display module 100 further includes an adhesive layer 30. The adhesive layer 30 is disposed between the display panel 10 and the support plate 22, and positioned in the adhesive region 22B.

Specifically, material of the adhesive layer 30 can be optical adhesive or pressure-sensitive adhesive, so as to achieve a good bonding and fixing effect on the display panel 10 and the support structure 20.

In addition, in the above arrangement, the adhesive layer 30 is disposed on the adhesive region 22B, so that an elastic potential energy in the elastic sheet 24 can be transferred to the display panel 10 through the adhesive layer 30 during the bending and flattening process of the display module 100, which ensures the display module having good recoverability during the flattening process, thus, bending fatigue wrinkles and film debonding are further reduced.

A specific attached region of the adhesive layer 30 can be set according to actual application requirements, which is not limited in the present application.

In the embodiment of the present application, the fluid material 201 and the elastic sheet 24 are arranged in the accommodation space 20*a* inside the support structure 20, and the friction stress between the support structure 20 and the display panel 10 is reduced by the fluid material 201, so that the shear stress generated between the support structure 20 and the display panel 10 caused by the bending is reduced. Moreover, the good deformation performance of the elastic sheet 24 further improves the deformation coordination between the display panel 10 and the support structure 20, therefore, the problem of unrecoverable wrinkles and film debonding in the bending process of the display module is relieved.

Compared with the display module in the conventional art, the support structure in the display module according to the present application includes the first encapsulation layer, and the second encapsulation layer, and the support plates sandwiched between the first encapsulation layer and the second encapsulation layer, and the support plates are arranged at intervals. The accommodation space is defined among the first encapsulation layer, the support plates, and the second encapsulation layer, the accommodation space is positioned corresponding to the bending region, and the fluid material is arranged in the accommodation space. The present application reduces the friction between the support structure and the display panel by arranging the fluid material in the accommodation space inside the support structure, so that the shear stress generated between the support structure and the display panel caused by bending is reduced. This solves the problem of unrecoverable wrinkles and film debonding during the bending process of the display module.

The present document uses specific embodiments to explain principles and implementation of the application. Descriptions of above embodiments are only used to help understand technical solutions and core ideas of the application. A person skilled in the art can make various modifications and changes to the above embodiments without departing from the technical idea of the present invention, and such variations and modifications are intended to be within the scope of the invention.

What is claimed is:

1. A display module, comprising: a support structure and a display panel disposed on the support structure,
   wherein the display panel comprises a bending region and a non-bending region defined on both sides of the bending region;
   the support structure comprises a first encapsulation layer, a second encapsulation layer, and a plurality of support plates sandwiched between the first encapsulation layer and the second encapsulation layer, wherein the support plates are arranged at intervals and correspondingly disposed in the non-bending region; and
   an accommodation space is defined by the first encapsulation layer, the support plates, and the second encapsulation layer, and correspondingly arranged in the bending region, wherein a fluid material is arranged in the accommodation space, and the fluid material is a lubricating material.

2. The display module according to claim 1, wherein the support structure further comprises an elastic sheet disposed between adjacent two of the support plates, and the elastic sheet is disposed in the accommodation space corresponding to the bending region.

3. The display module according to claim 2, wherein the elastic sheet comprises an elastic body and sliding parts connected to two ends of the elastic body, and the sliding parts are slidingly connected to the adjacent ones of the support plates.

4. The display module according to claim 3, wherein a sliding slot is defined on a side of each of the support plates close to the elastic sheet, and each of the sliding parts is disposed in the sliding slot.

5. The display module according to claim 3, wherein the elastic sheet is defined with at least one through hole.

6. The display module according to claim 5, wherein the elastic body is in an undulating configuration.

7. The display module according to claim 6, wherein the elastic body comprises a plurality of convex sheets arranged side by side at intervals and a connection section connected between adjacent two of the convex sheets, and a groove is formed between adjacent two of the convex sheets and the connection section.

8. The display module according to claim 7, wherein each of the convex sheets comprises a horizontal part and an inclined part connected to both sides of the horizontal part, and the inclined part is defined with the at least one through hole.

9. The display module according to claim 8, wherein a number of the at least one through hole is multiple, and the multiple through holes are uniformly spaced apart from each other along an extending direction of the inclined part.

10. A display module, comprising: a support structure and a display panel disposed on the support structure,
    wherein the display panel comprises a bending region;
    the support structure comprises a first encapsulation layer, a second encapsulation layer, and a plurality of support plates sandwiched between the first encapsulation layer and the second encapsulation layer, wherein the support plates are arranged at intervals; and
    an accommodation space is defined by the first encapsulation layer, the support plates, and the second encapsulation layer, and correspondingly arranged in the bending region, wherein a fluid material is arranged in the accommodation space.

11. The display module according to claim 10, wherein the fluid material is a lubricating material.

12. The display module according to claim 10, wherein the display panel further comprises a non-bending region defined on both sides of the bending region, the support structure further comprises an elastic sheet disposed between adjacent two of the support plates, the elastic sheet is disposed in the accommodation space and corresponding to the bending region, and the support plates are correspondingly disposed in the non-bending region.

13. The display module according to claim 12, wherein the elastic sheet comprises an elastic body and sliding parts connected to two ends of the elastic body, and the sliding parts are slidingly connected to the adjacent ones of the support plates.

14. The display module according to claim 13, wherein a sliding slot is defined on a side of each of the support plates close to the elastic sheet, and each of the sliding parts is disposed in the sliding slot.

15. The display module according to claim 13, wherein the elastic sheet is defined with at least one through hole.

16. The display module according to claim 15, wherein the elastic body is in an undulating configuration.

17. The display module according to claim 16, wherein the elastic body comprises a plurality of convex sheets arranged side by side at intervals and a connection section connected between adjacent two of the convex sheets, and a groove is formed between adjacent two of the convex sheets and the connection section.

18. The display module according to claim 17, wherein each of the convex sheets comprises a horizontal part and an inclined part connected to both sides of the horizontal part, and the inclined part is defined with the at least one through hole.

19. The display module according to claim 18, wherein a number of the at least one through hole is multiple, and the multiple through holes are uniformly spaced apart from each other along an extending direction of the inclined part.

20. The display module according to claim 12, wherein an encapsulation region and an adhesive region are defined on each of the support plates, the adhesive region is positioned on a side of the encapsulation region away from the bending region, a part of the first encapsulation layer is disposed in the encapsulation region, and the display module further comprises an adhesive layer disposed between the display panel and each of the support plates and positioned in the adhesive region.

\* \* \* \* \*